United States Patent
Francis et al.

(10) Patent No.: US 7,485,920 B2
(45) Date of Patent: Feb. 3, 2009

(54) PROCESS TO CREATE BURIED HEAVY METAL AT SELECTED DEPTH

(75) Inventors: Richard Francis, Manhattan Beach, CA (US); Chiu Ng, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/288,696

(22) Filed: Nov. 4, 2002

(65) Prior Publication Data

US 2003/0057522 A1   Mar. 27, 2003

Related U.S. Application Data (63) Continuation of application No. 09/593,472, filed on Jun. 14, 2000.

(51) Int. Cl.
*H01L 29/02* (2006.01)

(52) U.S. Cl. .................. 257/328; 257/335; 257/610; 257/131; 257/156; 257/590; 257/E29.027

(58) Field of Classification Search .......... 438/143, 438/471, 473, 511, 543, 542; 257/87, 130–131, 257/155–156, 590, 607–612, 126, 617, 520, 257/542, 543, 328
See application file for complete search history.

(56) References Cited

U.S. PATENT DOCUMENTS

| | | | | |
|---|---|---|---|---|
| 2,023,696 | A | * 12/1935 | Porteous ................ | 431/173 |
| 4,177,477 | A | * 12/1979 | Hokuyo et al. ........... | 257/156 |
| 4,223,328 | A | *  9/1980 | Terasawa et al. ......... | 257/136 |
| 5,025,293 | A | *  6/1991 | Seki .................... | 257/142 |
| 5,086,330 | A | *  2/1992 | Minato ................. | 257/263 |
| 5,198,882 | A |    3/1993 | Matsuda et al. .......... | 257/156 |
| 5,661,314 | A |    8/1997 | Merrill et al.          |        |
| 5,717,244 | A |    2/1998 | Soejima ................ | 257/617 |
| 5,747,872 | A |    5/1998 | Lutz et al.             |        |
| 5,851,857 | A | * 12/1998 | Kelberlau et al. ........ | 438/134 |
| 6,008,092 | A |   12/1999 | Gould .................. | 438/268 |
| 6,043,112 | A | *  3/2000 | Francis et al. ........... | 438/143 |
| 6,198,115 | B1 | *  3/2001 | Francis et al. .......... | 257/144 |
| 6,261,874 | B1 |    7/2001 | Francis et al. .......... | 438/133 |
| 6,774,407 | B2 | *  8/2004 | Kushida ................ | 257/131 |
| 2003/0057522 | A1 | 3/2003 | Francis et al. .......... | 257/566 |

FOREIGN PATENT DOCUMENTS

DE   4026797 A  *  2/1992

(Continued)

*Primary Examiner*—Jerome Jackson, Jr.
*Assistant Examiner*—Jose R Diaz
(74) *Attorney, Agent, or Firm*—Ostrolenk, Faber, Gerb & Soffen, LLP (57) ABSTRACT

Semiconductor devices having recombination centers comprised of well-positioned heavy metals. At least one lattice defect region within the semiconductor device is first created using particle beam implantation. Use of particle beam implantation positions the lattice defect region(s) with high accuracy in the semiconductor device. A heavy metal implantation treatment of the device is applied. The lattice defects created by the particle beam implantation act as gettering sites for the heavy metal implantation. Thus, after the creation of lattice defects and heavy metal diffusion, the heavy metal atoms are concentrated in the well-positioned lattice defect region(s).

10 Claims, 4 Drawing Sheets

FOREIGN PATENT DOCUMENTS

| | | | |
|---|---|---|---|
| JP | 54-055372 | | 5/1979 |
| JP | 57068068 A | * | 4/1982 |
| JP | 64-057756 | | 3/1989 |
| JP | 04348527 A | * | 12/1992 |
| JP | 10199894 A | * | 7/1998 |

* cited by examiner

PROCESS TO CREATE BURIED HEAVY METAL AT SELECTED DEPTH

RELATED APPLICATION

This application is a continuation of U.S. application Ser. No. 09/593,472, filed Jun. 14, 2000 by Richard Francis and Chiu Ng entitled PROCESS TO CREATE BURIED HEAVY METAL AT SELECTED DEPTH

BACKGROUND OF THE INVENTION

1. Field of the Invention

The invention relates to power semiconductor devices, such as insulated gate bipolar transistors (IGBTs), diodes and thyristors. In particular, the invention relates to improving performance of such devices through reduction of lifetime (also known as "lifetime killing").

2. Related Art

Figure 1:
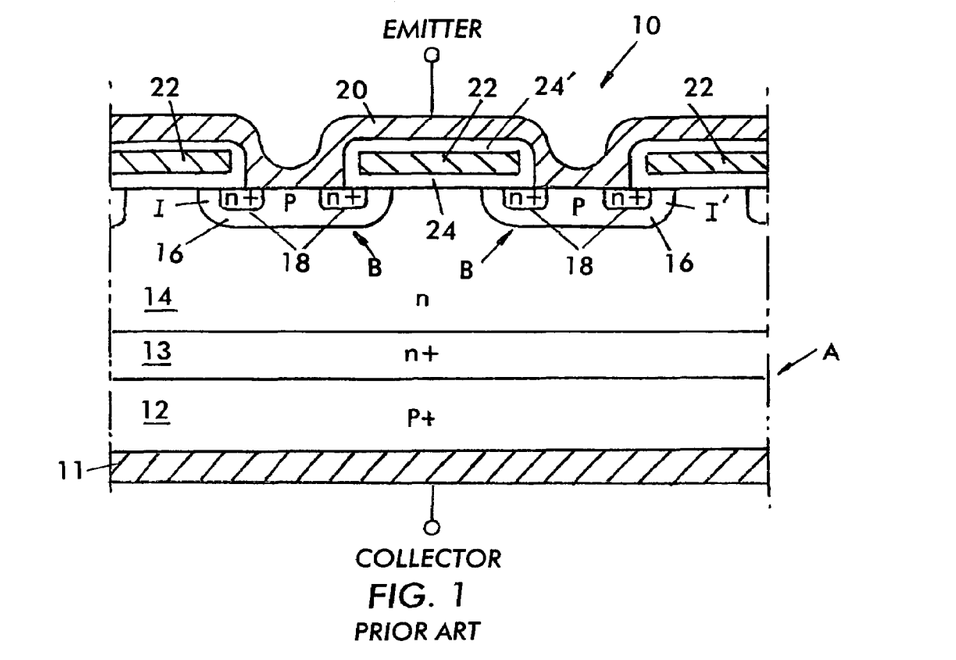
FIG. 1 is a cross-sectional view of a known insulated gate bipolar transistor device.

An IGBT 10 as generally known in the art is shown in FIG. 1. The IGBT 10 has collector electrode 11 connected to a p+ collector region 12. Above collector region 12 is n+ type buffer layer 13 and n type base region 14. A pn junction is formed at interface A between collector region 12 and n+ buffer layer 13. Typically, p+ collector region 12 is formed in the semiconductor wafer, while n+ buffer layer and n base region are epitaxially grown thereon. Base or channel diffusion regions 16, 16' of p material are formed at the upper surface of n region 14, forming p bases, as explained further below. A pn junction is thus formed at the interfaces B, B'.

(As seen, there is an array of diffusion regions in the upper surface of n region 14; one such adjacent region in the array is labeled with the same reference numbers including a prime designation. Additional analogous structure in the adjacent regions is also designated with a prime reference number.)

Within p-type diffusion region 16 is n+ diffusion region 18. (There appear to be two separate n+ diffusion regions in the cross-sectional view of FIG. 1; however, the n+ diffusion region 18 is actually a closed loop within p diffusion region 16 when viewed from above when using a cellular base geometry as shown in U.S. Pat. No. 5,661,314, for example.) An emitter electrode layer 20 contacts the central portion of p diffusion region 16 and an interior portion of n+ diffusion region 18.

A gate electrode 22 extends between the outer portion of n+ diffusion region 18 and the outer portion of n+ diffusion region 18' of the adjacent diffusion region. Gate electrode 22 is interposed between the surface of the semiconductor device 10 and the emitter layer 20 and is isolated from the surface of the semiconductor device 10 and the emitter electrode layer 20 by a conventional gate oxide 24 and a low temperature oxide (LTO) 24'.

The IGBT of FIG. 1 operates in a forward mode by applying a positive voltage at the collector electrode 11 with respect to the emitter electrode 20. When gate 22 is biased to a voltage above the threshold voltage $V_T$, an inversion of p base region 16 occurs at the region I. A path is thus formed for electrons through emitter 20, n+ diffusion region 18, the inverted portion of p base region 16 and into n base region 14 and n+ buffer layer 13. The pn junction A between this effective composite n region and the p+ region 12 is forward biased, thus providing a forward conducting state.

When the collector and the emitter are reversed biased, current flow is blocked because the pn junction at interface A is reversed biased.

An important operational parameter for many semiconductor devices, such as the IGBT described above, includes the switching speed or turn-off time. For example, when the device of FIG. 1 is operating in its saturated on condition, there are a large number of minority carriers in the n+ and n-regions 13, 14 and p+ region 12. This concentration of holes and electrons, respectively, must be removed before the transistor 10 returns to its off condition.

There are a number of known techniques for reducing the lifetime of minority carriers in such semiconductor devices. Thus, additional recombination centers in one or more of the regions of the semiconductor device may be provided. An increase of the recombination centers may adversely affect other important operational parameters of the device, such as the forward voltage drop $V_{ce}$.

One such technique for reducing carrier lifetime is electron irradiation of the device. The irradiation creates lattice defects in the crystal, which act as recombination centers of minority carriers. Because there is a relatively high level of control over the energy, positioning and profile of an electron beam, the degree of damage to the lattice is relatively accurate. Damage created by electron irradiation can be uniformly distributed throughout the silicon, or can be limited to particular sites. A disadvantage of electron irradiation is that the damage to the lattice anneals out at relatively low temperatures, thus reducing the effectiveness of the lifetime killing. The degree of annealing can be affected by other factors related to manufacturing the device. Also, silicon devices subjected to this technique of electron beam (E-beam) radiation demonstrate higher reverse current leakage at elevated temperatures. Further, electron irradiation normally acts uniformly over the full lateral width of the device.

A similar technique of lifetime killing uses particle beam implantation. The lattice damage created by a particle beam is also highly accurate and controllable. The position and degree of the lattice defects are dependent on the size, mass and implant energy of the particle used, among other factors. Thus, the position of the lattice defects can be localized to a particular depth and profile in the silicon. Also, multiple recombination centers can be positioned at different locations throughout the device. However, like E-beam irradiation, damage created by low doses of particle beam implants also anneals out of the silicon at relatively low temperatures; also, devices implanted with particle beams have higher reverse current leakage at elevated temperatures.

Another and very common technique of lifetime killing introduces recombination centers into the silicon through diffusion of heavy metals, such as gold or platinum. Typical heavy metal diffusion temperatures are between 600 and 1000° C. The diffusion temperature controls the solid solubility of the metal atoms in the silicon and thus the density of the impurities. Consequently, lifetime decreases with higher diffusion temperatures. Because of the nature of the heavy metal recombination centers, in many cases the devices have superior characteristics to those processed with electron irradiation or particle beam implants. Also, the recombination centers created by metal diffusion do not anneal out at the relatively low temperatures, as in electron irradiation or particle beam implants. However, heavy metal diffusion is a difficult process to control. Small variations in the processing conditions and/or the silicon used (for example, the substrate doping, manufacturing temperatures, etc.), can create a substantial variation in the lifetime killing, current amplification, forward voltage drop and other characteristics of the semiconductor device.

In general, techniques of fabrication of IGBTs such as that shown in FIG. 1 are known in the art. Materials used in such fabrication are also known. Further, determining and administering electron irradiation or particle beam implantation to a particular semiconductor device in order to create recombination centers at particular regions which reduce lifetime but do not render other operational characteristics unacceptable is either known or can be determined through developed techniques. (For example, U.S. Pat. No. 5,661,314 describes fabrication of an IGBT having certain structural features for improving the packing density and increasing latch current. Use of electron irradiation, or, alternatively, heavy metal diffusion, for reducing lifetime is also described.) Also, determining and administering the appropriate conditions to improve the lifetime of a device by creating recombination centers through heavy metal diffusion (without rendering other operation parameters unacceptable) is also known or can be determined through developed techniques. As noted above, this includes appropriate placement of the regions of lattice defects or heavy metal diffusion to reduce lifetime while maintaining acceptable current amplification and forward voltage drop.

While both contribute to lifetime killing, as noted above the performance characteristics of recombination centers comprised of heavy metal diffusion and recombination centers created via electron irradiation or ion implantation are different. Thus, U.S. Pat. No. 5,747,872 teaches using both types of recombination centers in the same device in order to achieve soft switching and reduction of dynamic avalanche effects over a wider temperature range. The recombination centers provided by the heavy metal diffusion contribute to reduction of carrier lifetime that avoids the dynamic avalanche effect at lower temperatures, but causes large switching power losses (which contributes to dynamic avalanche effects) at higher temperatures. The recombination centers provided by the electron irradiation or ion implantation contribute to the performance at higher temperatures.

SUMMARY OF THE INVENTION

It is an objective to provide reduced carrier lifetime in semiconductor devices while simultaneously minimizing the disadvantages found in the techniques of the prior art.

In particular, it is an objective of the present invention to provide regions of recombination centers in semiconductor devices that are accurately positioned and which are maintained under normal manufacturing and/or operating conditions of the device. The recombination centers reduce the lifetime of minority carriers at turn-off while other operational characteristics of the device, such as current amplification and forward voltage drop, are maintained at acceptable operating levels.

In accordance with these objectives, the present invention includes a method of generating recombination centers within a semiconductor device comprising the steps of creating at least one lattice defect region within the semiconductor device using particle beam implantation. Use of particle beam implantation positions the lattice defect region(s) with high accuracy in the semiconductor device.

Creating one or more lattice defect regions is followed by heavy metal implantation treatment of the device. The lattice defects created by the particle beam implantation act as preferential gettering sites for the heavy metal implantation. Thus, after heavy metal implantation treatment, the heavy metal atoms are concentrated in the lattice defect region(s).

The diffused heavy metal atoms create recombination centers that are positioned with the relatively high level of accuracy attendant to particle beam implantation. Thus, the precision of irradiation and implantation is combined with the stability and superior recombination aspects of heavy metal diffusion.

The combination provides a device which may be tailored so that the forward voltage drop and the switching speed (and switching loss) is optimized. As noted, additional recombination centers may generally increase the forward voltage drop of a device. On the other hand, by adding recombination centers, switching speeds are increased. (An increase in switching speed corresponds to a reduction in carrier lifetime. Also, switching loss, which arises from current fall time, is reduced with an increase in switching speed.) The invention provides a way to precisely tailor recombination centers comprised of heavy metal atoms using a select depth for the region, shape (including width) of the region and/or concentration (including a variable concentration) of the region. Introduction of the recombination centers thus increases the switching speed (and reduces the switching losses), while proper tailoring of the recombination centers reduces the adverse change in the forward voltage drop.

The invention also provides semiconductor devices with recombination centers comprised of heavy metals that are positioned in one or more well-defined regions of the device.

BRIEF DESCRIPTION OF THE DRAWINGS

FIG. 2b is a graphic representation of the carrier concentration of the various regions of the semiconductor device of FIG. 2a;

FIG. 3b is a graphic representation of the carrier concentration of the various regions of the diode of FIG. 3a.

DETAILED DESCRIPTION

Figure 2A:
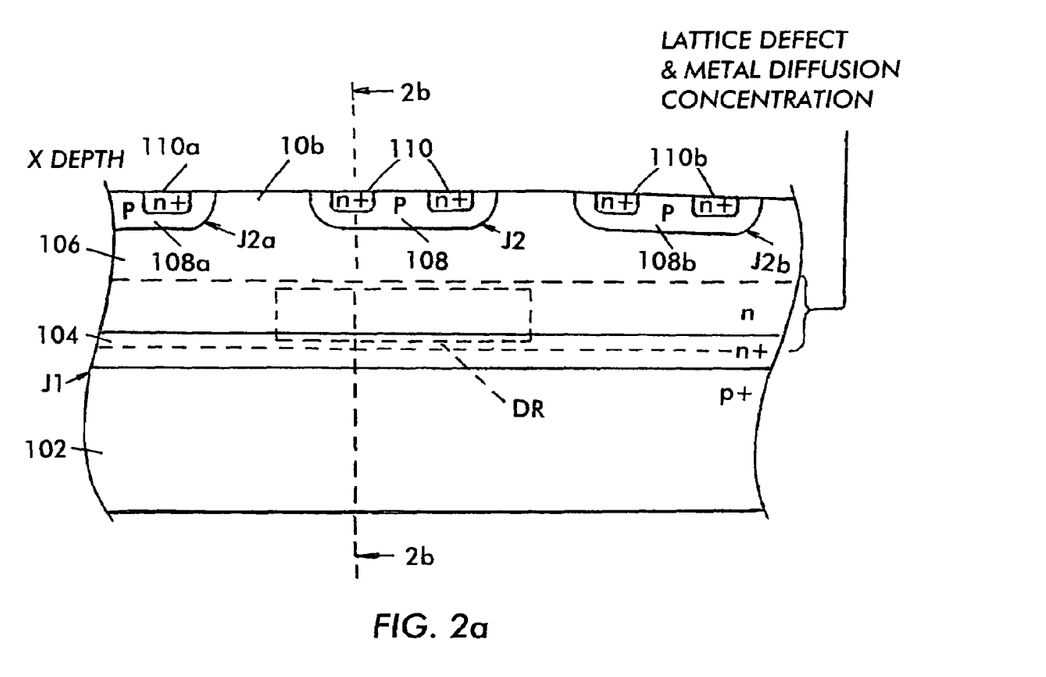
FIG. 2a is a cross-sectional view of an insulated gate bipolar transistor device of the present invention without metal electrode and gate layers.

FIG. 2a illustrates an insulated gate bipolar transistor device 100 according to the present invention. For example, n+ conductivity-type buffer layer 104 is epitaxially grown on the surface of p+ conductivity-type doped substrate 102, and n conductivity-type layer 106 is epitaxially grown on buffer layer 104. Note, however, that the invention to be described can be used in connection with float zone, non-epi die, and to devices employing a transparent anode. P conductivity-type diffusion region 108 is created at the surface of n conductivity-type layer 106. Typically, the device 100 will contain an array of such p conductivity-type diffusion regions 108 with any desired topology. For example, two p conductivity-type diffusion regions 108a, 108b are shown on either side of the central p conductivity-type diffusion region 108 in FIG. 2a. While the ensuing discussion only refers to diffusion region 108 and related structure, there may be hundreds or even thousands of corresponding regions in the surface of the n conductivity-type layer 106, such as those shown in the adjacent diffusion regions having an "a" or "b" suffix.

In FIG. 2a, a basic IGBT is used to describe embodiments of the invention. There are many deviations from the underlying structure shown in FIG. 2a which can improve certain operational parameters for certain conditions and applications. For example, U.S. Pat. No. 5,661,314 cited above has two components of the p conductivity-type diffusion region corresponding to p conductivity-type diffusion region 108 in FIG. 1, and also has an n+ conductivity-type region between p conductivity-type diffusion regions. The IGBT in FIG. 2a has been depicted at a more fundamental level, in order to focus on the inventive features of the present invention.

Within diffusion region 108 there is a ring-shaped ring-shaped, n+ conductivity-type diffusion region 110. As will be explained below in the description of FIG. 2d, the finished device has gates and electrodes similar to the device shown in FIG. 1. Thus, ring-shaped diffusion region 110 forms the emitter layer, p diffusion region 108 (when inverted by a gate) and the n and n+ conductivity-type layers 104, 106 form the base region, and the p+ conductivity-type substrate forms the collector. The device has pn junctions as shown at positions J1 and J2.

Figure 2B:
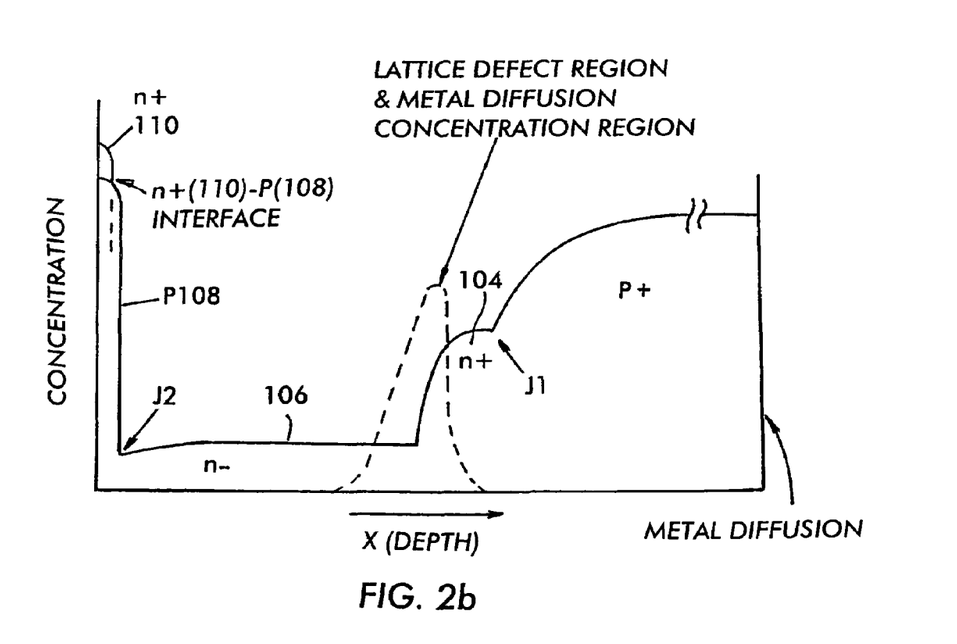

FIG. 2b is a graphical depiction of the relative concentration of carriers in the regions of the IGBT FIG. 2a as a function of the depth X in the device. The solid graphical depiction represents the concentration along line 2b-2b of FIG. 2a, that is, through the emitter region 110 and the p conductivity-type diffusion region 108. As seen, n+ conductivity-type region 110 is a shallow, high concentration region, p conductivity-type diffusion region 108 has a relatively high concentration, n conductivity-type layer 106 has a relatively low concentration, n+ conductivity-type layer 104 has an intermediate concentration and p+ conductivity-type doped substrate has a relatively high concentration.

The device of FIGS. 2a, 2b is prepared by first subjecting the semiconductor to particle beam implantation of an appropriate type, energy, duration, shape, etc. to create lattice defects in the silicon at a certain region in the usual manner. One such irradiated region is shown in phantom view in FIG. 2b, spanning n+ and n conductivity-type layers 104, 106 of the base, where effective carrier lifetime killing is desired in an IGBT. Thus, if the lattice defect region shown in FIG. 2b is created by particle beam implantation, then the phantom portion of the graph shows the relative concentration of the particles so implanted. In the prior art, the device is then completed and packaged, and is subject to the alloying out of the particle beam damage.

As described above, the lattice defects themselves provide additional recombination centers. However, in accordance with the invention, the device is next subjected to a heavy metal diffusion using gold or platinum or the like, as represented in FIG. 2b. The lattice defects caused by the beam irradiation or the like act as gettering sites for the metal atoms, so following the diffusion, metal atoms are also concentrated in the preferred region shown in phantom in FIG. 2b and are not evenly diffused through the silicon lattice as in the prior art.

The lattice defect region is chosen so that it is remote from the pn junctions J1 and J2. Thus, the impact of the recombination centers introduced by the metal diffusion on the current gain and forward voltage drop is lessened while lifetime (and switching loss) is reduced.

The lattice defect region need not extend laterally throughout the package at a certain depth, but instead may be shaped to customized contours through control of the particle beam implantation. For example, referring back to FIG. 2a, an alternative lattice defect region DR shown in phantom is limited to an area below diffusion region 108, instead of generally extending throughout the device normal to the X direction, as in the embodiment also shown in FIG. 2a and described above. Thus, the switching of the current from diffusion region 108 would be faster than other diffusion regions. By creating lattice defect regions in a select manner, the performance of the device may be modified.

As noted, while additional recombination centers generally increase the switching speed (by reducing lifetime), they may also increase the forward voltage drop of a device. In general, the configuration of a lattice defect region (i.e., the depth, width, concentration of defects) and the resulting heavy metal recombination centers may be tailored so that the effect on the forward voltage drop is minimized while the switching speed of the device is nonetheless increased. Thus, an increase in the forward voltage drop from an increased dose of irradiation (which results in increased lattice defects and an increase in the number of heavy metal recombination centers gettered in the lattice defect region) can be offset by tailoring the configuration and position of the lattice defects and recombination centers.

Figure 2C:
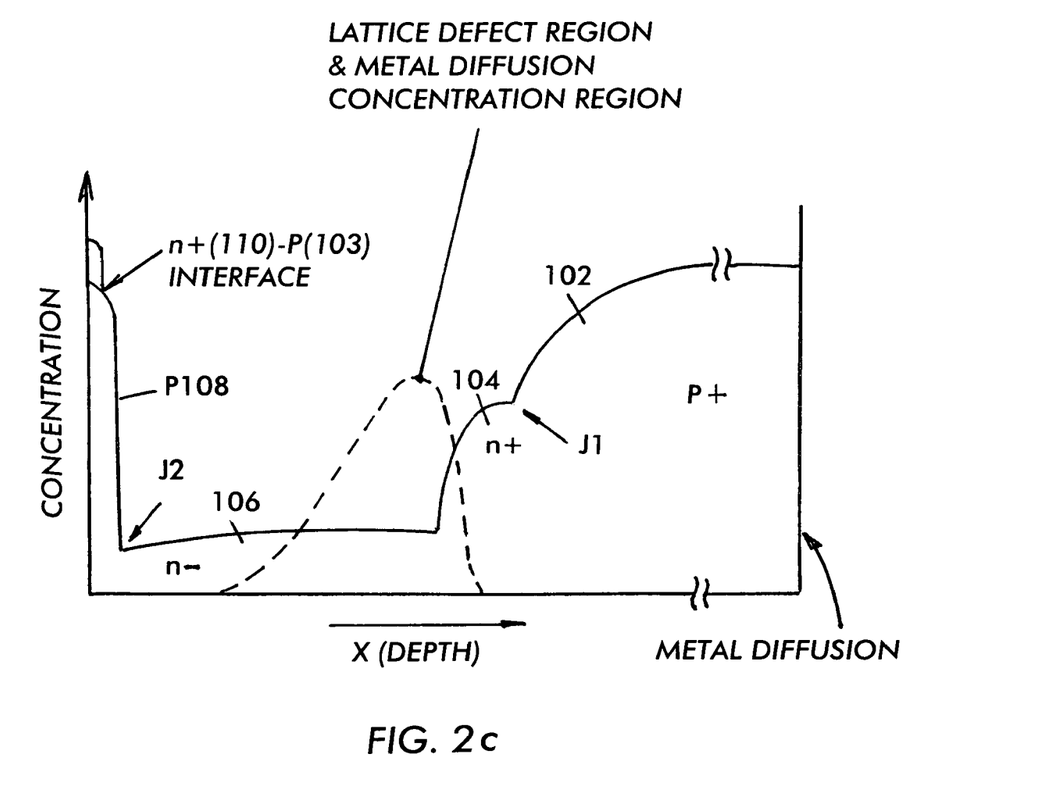
FIG. 2c is a graphic representation as in FIG. 2b, showing an alternative configuration of the lattice defect region and heavy metal diffusion concentration region.

FIG. 2c, for example, shows an alternative configuration of the recombination center region shown graphically in FIG. 2b. In FIG. 2c, the maximum concentration of the recombination centers is shifted to the left, and the concentration is not symmetric.

Adjusting the configuration and position of the recombination centers may, on the other hand, curtail the benefit in the switching speed of the device; however, the recombination centers may be configured so that an optimum balance point between forward voltage drop and switching speed may be achieved.

In general, desired or optimal placement, profile, concentration, etc. of the lattice defect region and the resulting metal diffusion concentration region is also dependent on the structure of the semiconductor device, the conditions of manufacture of the device, and the materials of the device, among other things. The data and techniques of simple electron irradiation, particle beam implantation or heavy metal diffusion may be used in the present invention to determine where it is desirable to position the recombination centers in various semiconductor devices, as well as the profile and concentration of such recombination centers.

EXAMPLE 1

An IGBT rated for 1200V having structure as depicted in FIG. 2a and having the relative concentrations shown in FIG. 2b is constructed with the following widths:

p+ substrate (102) approx. 375 microns
n+ layer (104) approx. 12 microns
n layer (106) approx. 100 microns
p diffusion region (108) approx. 4-5 microns
n+ diffusion region (110) approx. 0.3 microns The structure is subjected to a particle beam implant of helium or hydrogen atoms through the back surface of the wafer using known techniques, dosages and energy to attain an implant profile of the concentration and position shown in FIG. 2b. The beam is applied homogeneously across the surface. The implant creates a lattice defect region across the device at the interface of n layer 106 and n+ layer 104 (i.e., peak concentration of the lattice defect region at a nominal depth of 100 microns).

The device is then subjected to metal diffusion, for example, gold, palladium or platinum, through the back wafer surface, or lower surface of p+ doped substrate 102 at an appropriate temperature, concentration and time to attain the desired drive in. The heavy metal atoms concentrate in the lattice defect region described above at a concentration determined by the diffusion parameters. The device as fabricated has reduced carrier lifetime without an unacceptable increase in forward voltage drop.

In general, the lattice defect regions for semiconductor devices such as IGBTs may be created using particle beam implantation of He or H atoms at a dose of $1 \times 10^{11}$ to $1 \times 10^{17}$ atoms/cm$^2$ and energy determined by the depth of the desired defect region, materials involved, etc. The heavy metal diffusion may use platinum or gold atoms at a temperature of 600 to 1000° C. The drive in time and dosage is determined by the depth of the defect region, the materials and the desired concentration of the metal concentration region.

The lattice defects created by the particle beam implantation need not necessarily precede the diffusion. The heavy metal may first be diffused into a region. Lattice defects may then be created at desired location(s) using particle beam implantation, which act as gettering sites for the metals. Additional heating may be required so that the metal atoms concentrate in the defect region.

Figure 2D:
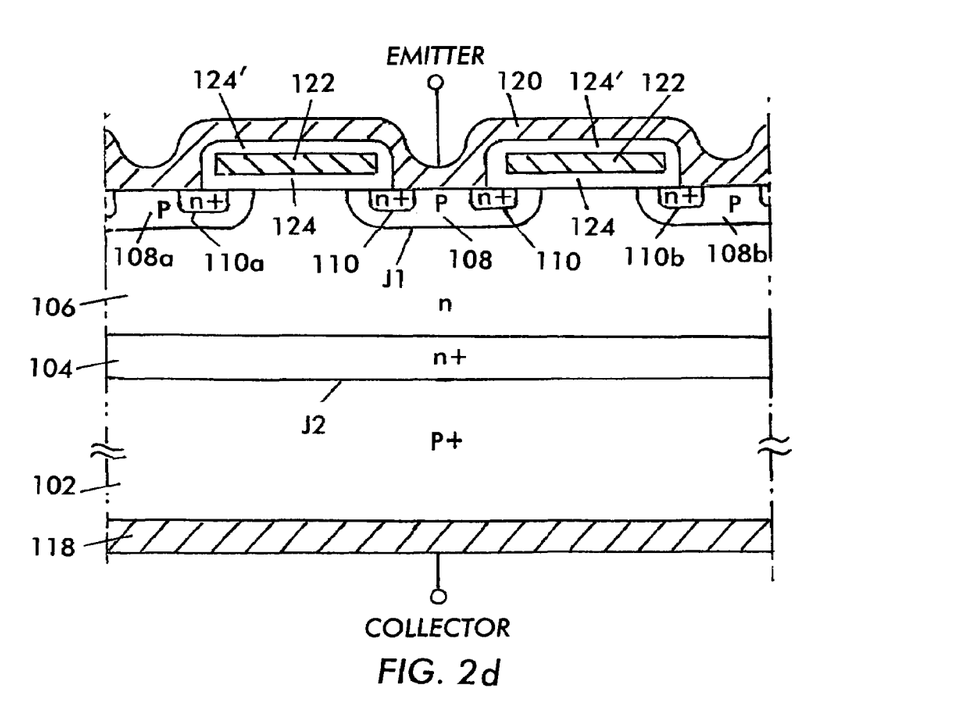
FIG. 2d is a cross-sectional view of the insulated gate bipolar transistor device of FIG. 2a with metal electrode layers.

After creation of the metal diffusion region shown in FIGS. 2a and 2b, the gate 122, emitter 120 and collector 118 layers are then fabricated as shown in FIG. 2d using known fabrication techniques. Gate 122 is isolated by insulating layers 124, 124'. The basic gate operation of the IGBT is as described above with respect to FIG. 1. Of course, an IGBT having doped regions opposite those shown in FIG. 1 (i.e., a p channel DMOS pattern can be formed in the top die surface) may be fabricated in accordance with the invention. For an n channel DMOS structure, gold may be used as the heavy metal.

Although the present invention is particularly suited for creation of accurately positioned heavy metal recombination centers in IGBTs, it is generally suited to semiconductor devices where such properties are desirable. Another such device is a high speed diode such as that shown in FIG. 3a. The high speed diode 200 is comprised of relatively thick n+ conductivity-type float zone region 202 having an epitaxially deposited n− conductivity-type region 204. A thin p+ conductivity-type region 206 is diffused into the n− conductivity-type region 204. The diode as shown in FIG. 3a includes the metal electrode layers, in particular cathode electrode 210 on n+ region and anode electrode 212 on p+ region.

Figure 3A:
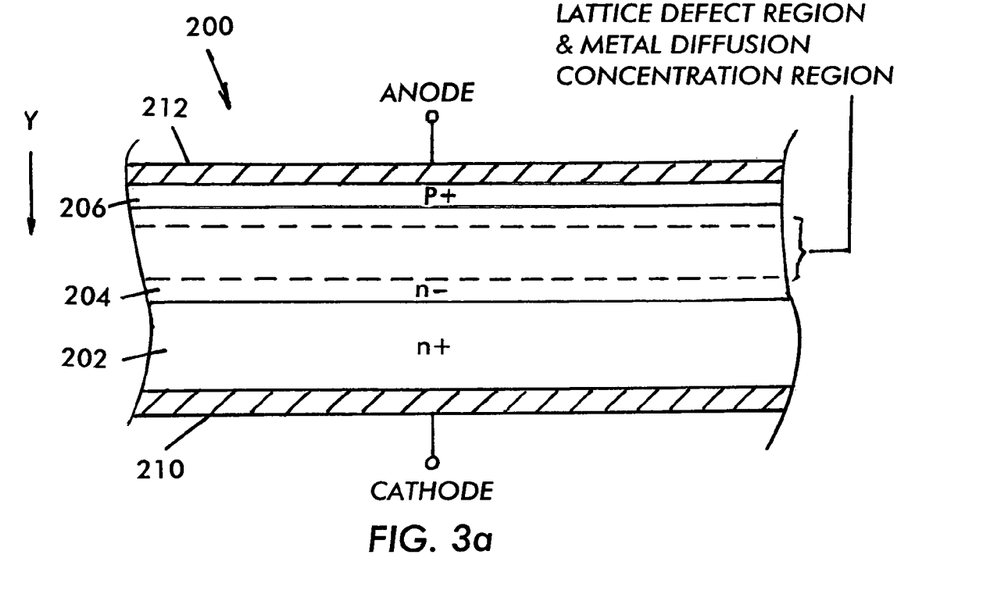
FIG. 3a is a cross-sectional view of a diode which employs the present invention.
Figure 3B:
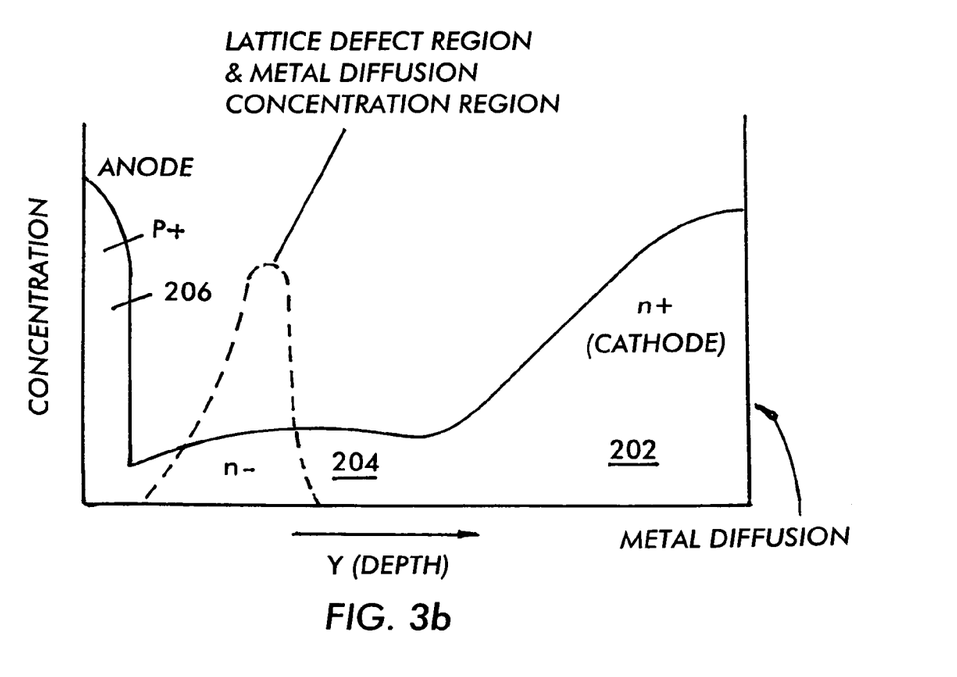

FIG. 3b illustrates the relative carrier concentration in the three regions of the diode 200 as a function of depth Y into the device. A lattice defect region is created within the silicon in a manner similar to that described above for the IGBT. That is, after fabricating regions 202, 204, 206, but before fabricating the metal electrodes 210, 212, the diode is subjected to particle beam implantation. One or more lattice defect regions are then created in precisely determined locations within the silicon, and having an appropriate profile that is pre-determined by whether electron irradiation or particle beam implantation is used, energy of the electrons or particles, type of particles, profile of the beam, time and dosage and the incident surface used, among other factors. As noted above, the positioning and contours of such lattice defect regions using particle beam implantation is relatively precise and is either known or determinable using known techniques for a specific semiconductor device.

One such lattice defect region is shown in phantom in FIG. 3b. The region is positioned in the n− conductivity-type region 204, slightly less than half-way between p+ region 206 and n+ region 202. So positioning the lattice defect region provides additional recombination centers in the n− conductivity-type region 204, sufficiently far from the junction with the p+ region, where additional recombination centers would adversely affect other operational characteristics of the diode.

Because the region of the diode are uniform, the lattice defect region would typically extend throughout the diode normal to the Y direction, as shown in FIG. 3a. However, the lattice defect regions could be localized to particular regions if the design required. More than one lattice defect region and variable defect concentration over the defect region is also possible, defending on device requirements.

The device is then subjected to a heavy metal diffusion, as represented in FIG. 3b in dotted lines. The lattice defects again act as gettering sites for the metal atoms. After diffusion of the metal atoms, the metal atoms become concentrated in the lattice defect region shown in phantom in FIGS. 3a and 3b. Thus, the metal atoms are positioned in the well-defined area created by the particle beam implantation, and provide recombination centers having superior characteristics to those provided by lattice defects alone. As noted above for the IGBT, the configuration (such as depth, width, concentration, shape) of the lattice defect region and resulting heavy metal combination centers may be adjusted to offset increases in the forward voltage drop, while maintaining desired increases in switching speed. If necessary, a configuration may be chosen to achieve an optimum balance between the forward voltage drop and the switching speed of the device.

EXAMPLE 2

A fast recovery diode rated for 600V having structure as depicted in FIG. 3a and having the relative concentrations shown in FIG. 3b is constructed with the following widths:

n+ region (202) approx. 250 microns
n− region (204) approx. 60 microns
p+ region (206) approx. 6 microns Before fabrication of the anode electrode 212 and cathode electrode 210 shown in FIG. 3a, the device is subjected to a particle beam implant of helium atoms with a dose of from $5 \times 10^{13}$ atoms/cm$^2$ to $1 \times 10^{15}$ atoms per cm$^2$ using known techniques and appropriate energy to attain an implant profile of the concentration and position shown in FIG. 3b. The beam is applied homogeneously across the surface. This creates a lattice defect region across the device at a nominal depth Y (for the peak concentration of helium atoms) of 25 microns and a lateral width of about 15 microns.

The device is then subjected to metal diffusion. Platinum is diffused into lower n+ region at a temperature of 600 to 1000° C. for 10 to 30 minutes. The exact temperature, time, concentration is tailored to attain the desired drive in. The platinum concentrates in the lattice defect region described above at a concentration determined by the diffusion parameters.

The device as fabricated has reduced carrier lifetime without an unacceptable increase in forward voltage drop.

EXAMPLE 3

A fast recovery diode rated for 600V having structure as depicted in FIG. 3a and having the relative concentrations shown in FIG. 3b is constructed with the following widths:

n+ region (202) approx. 250 microns
n− region (204) approx. 60 microns
p+ region (206) approx. 6 microns Before fabrication of the anode electrode 212 and cathode electrode 210 shown in FIG. 3a, the device is subjected to a particle beam implant of helium atoms with a dosage of approximately $1 \times 10^{12}$ to $1 \times 10^{15}$ atoms/cm$^2$ using known techniques and appropriate energy to attain an implant profile having the desired concentration and position. The beam is applied homogeneously across the surface. This creates a lattice defect region across the device at a nominal depth Y (for the peak concentration of helium atoms).

The device is then subjected to metal diffusion. Platinum is diffused into lower n+ region at a temperature of 600 to 1000°

C. for 10 to 30 minutes. Again, the exact temperature, time and concentration is tailored to attain the desired drive in. The platinum concentrates in the lattice defect region described above at a concentration determined by the diffusion parameters.

The device as fabricated has reduced carrier lifetime without an unacceptable increase in forward voltage drop.

As noted above, the invention is not limited to a particular semiconductor device, such as the IGBT and fast recovery diode examples given above. In general, the invention pertains to any semiconductor device where additional recombination centers are desirable or necessary. The one or more lattice defect regions may be created through electron irradiation, particle beam implantation, or a combination thereof. The lattice defect regions may extend throughout the semiconductor device or may be customized to a particular region within the device. How to create and accurately position such lattice defect regions (which provide recombination centers themselves) for particular semiconductor devices having particular materials in order to reduce lifetime, while preserving other operational characteristics of the device at acceptable levels, is either known or can be readily determined through known techniques.

According to the invention, the well-positioned lattice defect regions act as gettering sites for heavy metal atoms diffused into the device. The greater the degree of lattice defect, the more gettering of metal atoms in the region. In general, the selection of metals, concentration, diffusion temperature and time of exposure, among other conditions, to obtain a desired level of heavy metal diffusion is either known for particular devices having particular material layers, or is readily determinable. Since the lattice defect sites attract and thus concentrate the heavy metal atoms, diffusion parameters must be adjusted to account for such concentration from prior art diffusion parameters, which by themselves resulted in broader regions of recombination centers. Necessary adjustment of diffusion parameters is within the ability of one skilled in the art.

For all such devices, the configuration (such as depth, width, concentration, shape) of the lattice defect region and resulting heavy metal combination centers may also be adjusted to offset increases in the forward voltage drop, while maintaining desired increases in switching speed. If necessary, a configuration may be chosen to achieve an optimum balance between the forward voltage drop and the switching speed of the device.

Accordingly, although the present invention has been described in relation to particular embodiments thereof, many other variations and modifications and other uses will become apparent to those skilled in the art. Thus, the present invention is not limited by the specific disclosure herein.

What is claimed is:

1. A method of fabricating a semiconductor device comprising the steps of:
    a) providing a semiconductor die, having a semiconductor body with a top surface and a bottom surface, and a plurality of spaced PN junctions formed in said top surface thereof;
    b) creating a lattice defect region under at least one of said PN junctions and limited to an area below said at least one PN junction by particle beam implantation through said bottom surface, said lattice defect region comprising lattice defects having a varying concentration in said semiconductor body of said die at a predetermined depth below the top surface, said lattice defect region having a thickness within which the concentration of the lattice defects is between a maximum concentration level and a minimum concentration level;
    c) diffusing heavy metal atoms into the semiconductor die; and
    d) applying heat for a predetermined time sufficient to drive the heavy metal atoms into the lattice defects to form a region of lattice defect and heavy metal diffusion that has a concentration profile which ranges between a minimum level and a maximum level; wherein said at least one PN junction is disposed between two other PN junctions, and wherein said lattice defect region does not extend to regions below said two other PN junctions.

2. A method of fabricating a semiconductor device as in claim 1, wherein the semiconductor device is an insulated gate bipolar transistor.

3. A method of fabricating a semiconductor device as in claim 2, wherein the step of creating said lattice defect region comprises creating lattice defects in a base region of insulated gate bipolar transistor.

4. A method of fabricating a semiconductor device as in claim 3, wherein the step of subjecting the device to a diffusion of heavy metal atoms comprises a diffusion of platinum atoms.

5. A method of fabricating a semiconductor device as in claim 3, wherein the step of subjecting the device to a diffusion of heavy metal atoms comprises a diffusion of gold atoms.

6. A method of fabricating a semiconductor device as in claim 1, wherein the step of creating said lattice defect region in the device is performed before the step of subjecting the device to a diffusion of heavy metal atoms.

7. A method of fabricating a semiconductor device as in claim 1, wherein the step of creating said lattice defect region in the device is performed after the step of subjecting the device to a diffusion of heavy metal atoms.

8. A method of fabricating a semiconductor device as in claim 1, wherein the step of creating said lattice defect region in the device is performed simultaneously with the step of subjecting the device to a diffusion of heavy metal atoms.

9. A method of fabricating a semiconductor device as in claim 1, wherein the step of subjecting the device to a diffusion of heavy metal atoms comprises a diffusion of atoms selected from the group consisting of platinum and gold.

10. A method of fabricating a semiconductor device as in claim 1, wherein said lattice defect region is surrounded on all sides by said semiconductor body.

* * * * *